United States Patent [19]

Alvarez

[11] Patent Number: 4,820,973

[45] Date of Patent: Apr. 11, 1989

[54] IMPEDANCE MEASURING SYSTEM

[76] Inventor: Jose A. Alvarez, 917 Cross Ave., Elizabeth, N.J. 07208

[21] Appl. No.: 223,697

[22] Filed: Jul. 22, 1988

Related U.S. Application Data

[63] Continuation of Ser. No. 934,181, Nov. 21, 1986, abandoned.

[51] Int. Cl.$^4$ ............................................. G01R 27/26
[52] U.S. Cl. .................................. 324/61 R; 307/261; 324/60 C
[58] Field of Search ........................... 324/61 R, 60 C

[56] References Cited

U.S. PATENT DOCUMENTS

| | | | |
|---|---|---|---|
| 2,866,337 | 12/1958 | Minneman et al. | 324/61 R X |
| 3,519,923 | 7/1970 | Martin | 324/61 R |
| 3,668,523 | 6/1972 | Kuhn | 324/60 C X |
| 3,986,108 | 10/1976 | Thomas | 324/60 C |

Primary Examiner—M. H. Paschall
Assistant Examiner—Morris Ginsburg
Attorney, Agent, or Firm—Sanford J. Asman

[57] ABSTRACT

The amount of liquid dielectric fuel in a tank is monitored with a capacitor including first and second electrodes immersed in the fuel. The fuel level determines the capacitance between the electrodes. Contaminants in the fuel are reflected as a shunt resistor for the capacitance between the electrodes. A periodic symmetrical triangle voltage is applied to the electrodes. The impedance between the electrodes responds to the voltage by deriving a composite current having a constant amplitude square wave component and a component that is a replica of the periodic voltage. The amplitude of the constant amplitude component is determined, in one embodiment, by sampling the amplitude of the composite current at the center of each square wave component to indicate the capacitance and the amount of fuel in the tank independently of effects of the shunt resistor on the electrodes. In a second embodiment, the amplitude of the composite current is sampled at two different times to indicate the slope of the replica and provide a measure of the resistor. By interpolating the two sampled amplitudes the capacitance is determined.

39 Claims, 4 Drawing Sheets

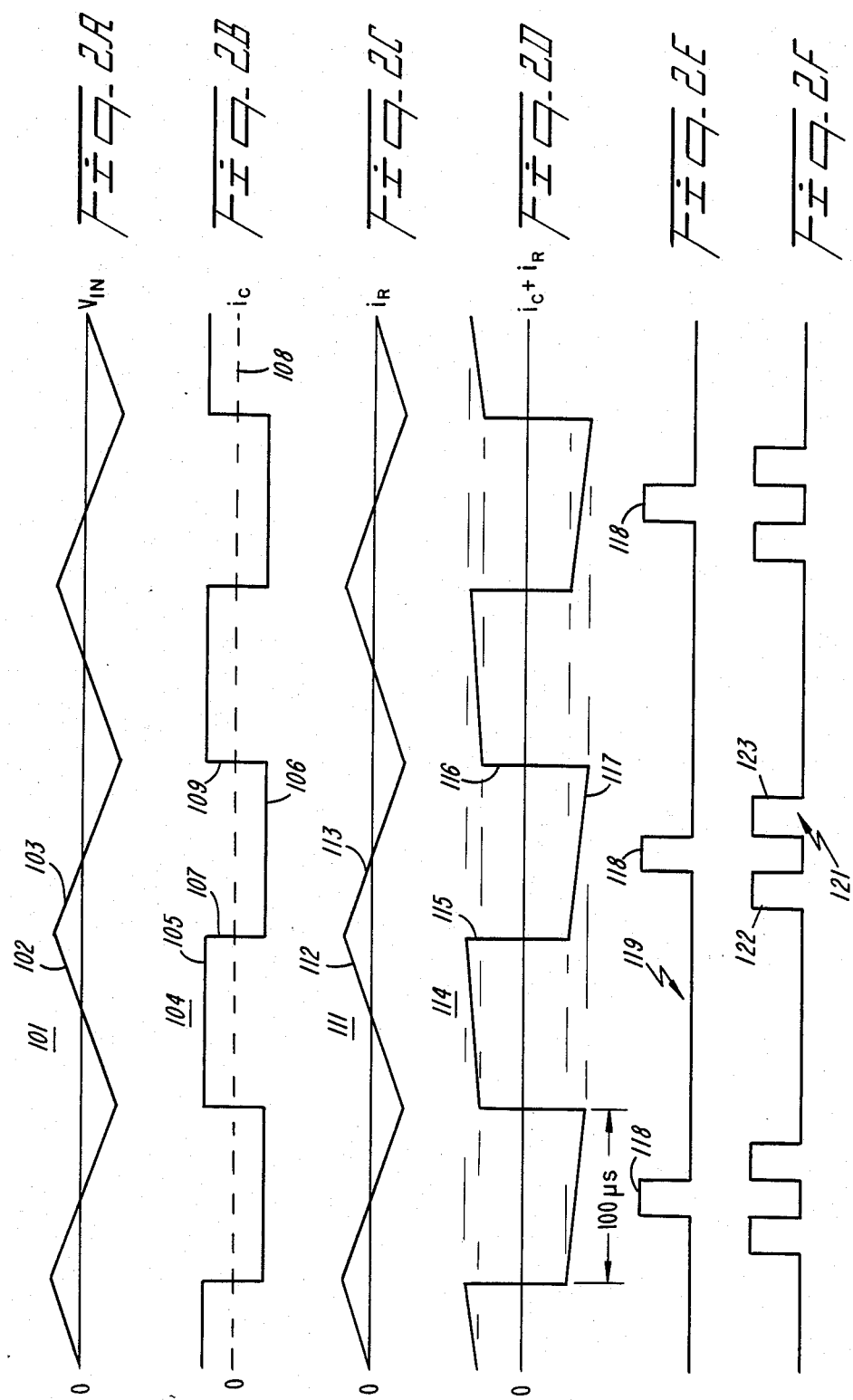

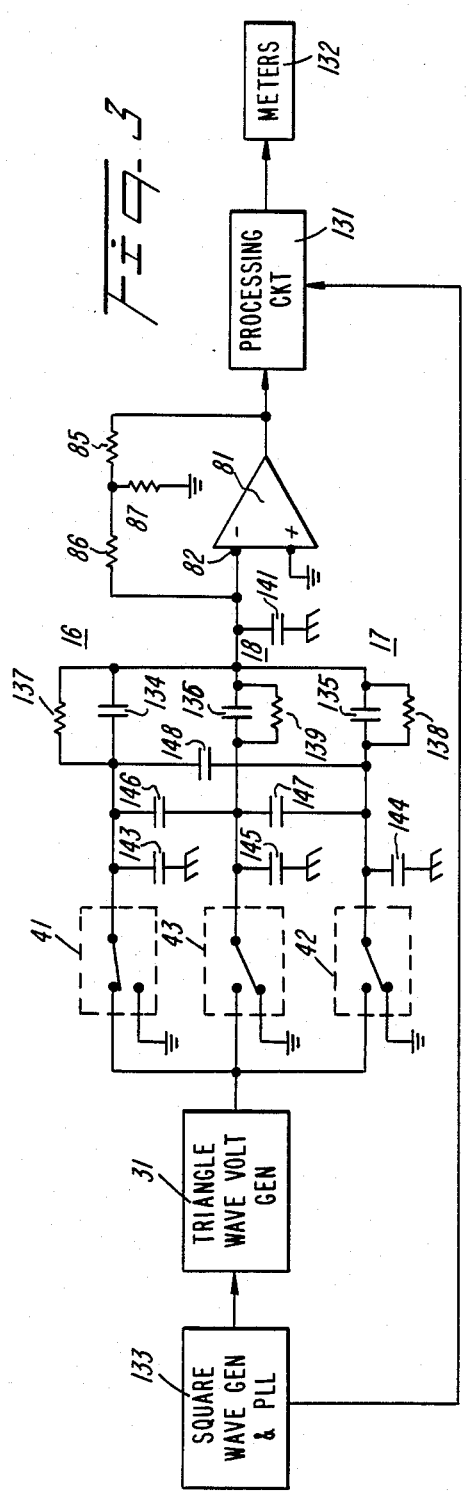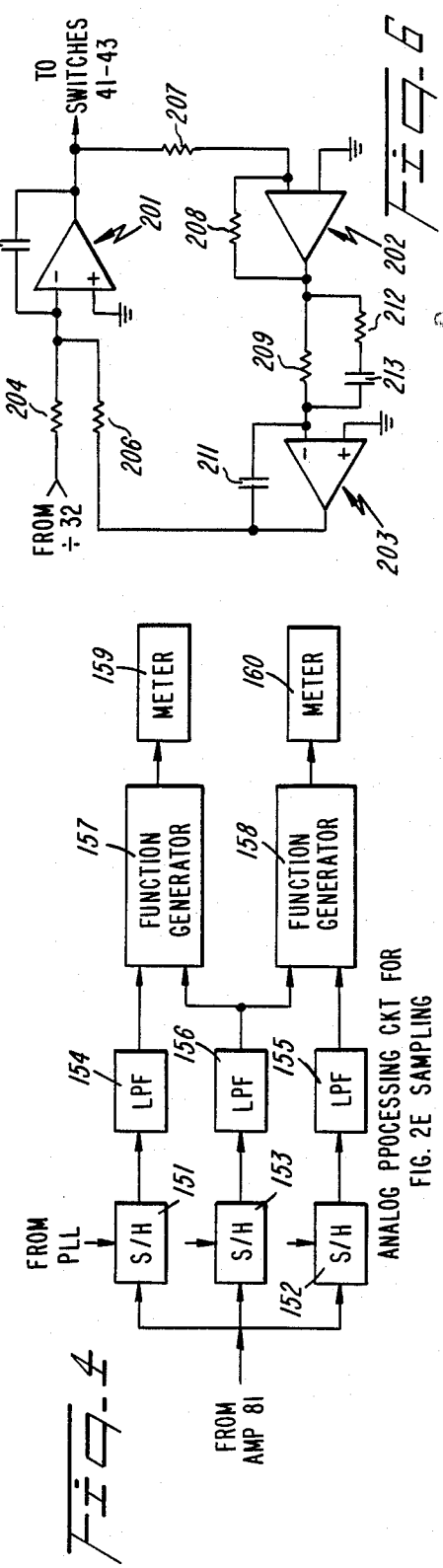

IMPEDANCE MEASURING SYSTEM

This application is a continuation of application Ser. No. 934,181 filed Nov. 21, 1986 now abandoned.

TECHNICAL FIELD

The present invention relates generally to impedance measuring systems and more particularly to a system for measuring the value of a capacitor shunted by a resistor by applying a periodic voltage that increases linearly as a function of time to the capacitor and for effectively measuring the amplitude of a resulting constant amplitude current component and the slope of a linearly increasing current component. In accordance with a further aspect of the invention, the value of a capacitor is measured with a DC operational amplifier having an inverting input terminal at virtual ground potential connected to the capacitor aspect of the invention, a triangular wave generator includes feedback circuitry for suppressing saturation tendencies of an operational amplifier in the generator.

BACKGROUND ART

Impedance measurements are frequently employed to determine the values of various parameters. In one specific application, the volume of dielectric liquid fuel in a tank is monitored by immersing electrodes in the liquid. The capacitance of the liquid between the electrode has been measured in many ways, e.g. by employing it as a frequency determining impedance of a variable frequency oscillator, the frequency of which is monitored in a conventional manner. In other systems, the capacitance is measured by applying a sinusoidal voltage to the electrodes and determining the voltage flowing to the electrodes. Since the amplitude of the current has a predetermined value the current provides a measure of the capacitor value.

In systems of this type, the dielectric liquid fuel is subject to contamination due to various factors, such as dirt and water. The contamination modifies the impedance between the electrodes so that an equivalent circuit of the impedance is a capacitance, determined by the dielectric fluid, shunted by a resistor having a value determined by the contaminants. Some of the prior art systems have been able to provide compensation for the variable resistance due to the contamination. However, there is, to my knowledge, no prior art system which has provided a measurement of the resistance due to the contamination.

It is, accordingly, an object of the present invention to provide a new and improved apparatus for measuring the value of a capacitor.

It is another object of the present invention to provide a new and improved apparatus for measuring the value of a capacitor and for measuring the value of a resistor in shunt with the capacitor.

A further object of the invention is to provide a new and improved system for monitoring the amount of liquid dielectric fuel in a tank.

A further object of the invention is to provide a new and improved system for monitoring the amount of liquid dielectric fuel in a tank and for providing a measurement of the resistance of contaminants in the liquid.

DISCLOSURE OF INVENTION

In accordance with one aspect of the invention, the value of a capacitor is measured by applying a periodic voltage that increases linearly as a function of time to the capacitor. The capacitor responds to the voltage by deriving a current having a constant amplitude component that is measured to indicate the capacitor value.

In accordance with a second aspect of the invention, the value of a capacitor having a resistor in shunt therewith is measured in such a manner that the value of the shunt resistor has no effect on the measurement. A periodic voltage with a symmetrical triangular waveform having a zero average value is periodically applied to the capacitor and shunt resistor. The capacitor and resistor respond to the voltage to derive first and second current components. The first, i.e., capacitive responsive, current component is shaped as a square wave having positive and negative constant amplitude segments. The second, i.e., resistive responsive, current component is a replica of the symmetrical triangular waveform with a slope having a value determined by the value of the shunt resistor. The replica component has a zero crossing time coincident with the center of each square wave constant amplitude segment. The two components are superimposed as a sum on each other. The value of the superimposed components at the time of the zero crossing of the second component is determined to provide a measurement of the capacitor value independently of the value of the shunt resistor. The capacitor value is accurately measured by this technique even if the shunt resistor is non-linear. This is because the replica component has a zero value at the time the sum of the superimposed components is determined.

In accordance with still a further aspect of the invention, the value of a resistor shunting a capacitor is measured by supplying the resistor and capacitor with a periodic voltage having a waveform that increases linearly as a function of time. The resistor and capacitor respond to the voltage to derive first and second current components. The first current component is shaped as a replica of the waveform and has a slope determined by the value of the resistor. The second current component has constant amplitude segments separated by step transitions. The two components are superimposed, i.e., summed with each other. From a pair of sampled values of the superimposed components, the slope of the first component is determined to provide a measure of the value of the resistor. With this system the value of the capacitor can be determined from the value of the superimposed components at the time corresponding to the middle of a constant amplitude segment if the periodic voltage is a symmetrical triangular waveform, as discussed supra. Alternatively, with this system it is possible to determine the value of the capacitor by effectively interpolating the two sampled values to the zero crossing time of the sloping component.

In accordance with a further aspect of the invention, the amount of liquid dielectric fuel in a tank is monitored with a capacitor including first and second electrodes immersed in the fuel. The level of the liquid dielectric fuel determines the capacitance between the first and second electrodes. The fuel has a tendency to have contaminants therein, which contaminants are reflected as a shunt resistor for the capacitance between the first and second electrodes. A periodic voltage that increases linearly as a function of time is applied to the first and second electrodes. The capacitor responds to the voltage by deriving a current having a constant amplitude component and a component that is a replica of the periodic voltage. The two components are superimposed on each other, i.e., summed together. The amplitude of the constant amplitude component is measured to indicate the amount of fuel in the tank independently of effects of the shunt resistor on the electrodes. The extent of the contaminants is determined by indicating the slope of the replica which provides a measure of the resistance value of the resistor. The capacitance value of the variable volume fuel is compared with a reference capacitance value derived from a tank having a constant dielectric liquid level to provide a volume measurement independent of liquid dielectric constant.

In using the present invention for remote capacitance measurements, such as for monitoring the amount of liquid dielectric fuel in a tank, it was realized that there are problems associated with stray capacitance between and in lines coupled between the measuring capacitance and circuitry responsive to the measured capacitance and which provides the desired indications. In accordance with another aspect of the invention, the effects of these stray capacitances are virtually eliminated.

In particular, one electrode of the capacitor is connected to a periodic voltage source having a zero average value and a predetermined fundamental frequency. A DC amplifier having a cutoff frequency greater than the predetermined frequency has an inverting input terminal connected to one terminal of an inner line of a shielded cable. The inner line has a second terminal connected to the other electrode of the capacitor. The operational amplifier has a non-inverting input terminal that is grounded so there is a shunt capacitance of the coaxial cable between the inner line and the shield across the inverting and non-inverting terminals. The operational amplifier is arranged so the inverting input terminal is at virtual ground potential so that there is virtually no voltage between the inverting and non-inverting input terminals. The capacitor and AC voltage source are connected in series with each other and the inverting input terminal. The inner line current thus supplies a current to the inverting input terminal indicative of the value of the capacitor.

The operational amplifier responds to the current supplied to the inverting input terminal thereof to derive an output voltage that is a replica of the current supplied to the inverting input terminal. The input current and output voltage are virtually independent of the capacitance of the shielded cable between the inner line and shield thereof. Stray capacitances which exist in unshielded lines between the voltage source and several electrode pairs which are measured have the same effect on the voltage derived by the operational amplifier because of a switching arrangement provided between the source and the electrode pairs.

It is, accordingly, still a further object of the invention to provide a new and improved system for measuring the value of a capacitor independently of the length of a shielded cable connected between the measured capacitor and a measuring circuit.

As indicated one aspect of the invention involves deriving a periodic triangular waveform. It has been proposed in the past to generate a periodic triangular waveform by supplying an integrator with a periodic voltage having a pair of constant amplitude values displaced by a step transition. For a symmetrical triangular waveform the input to the integrator in such an instance is a square wave.

In experiments I have conducted utilizing an integrator including an operational amplifier with a resistive input and a capacitive feedback impedance, I have found that a triangular wave is derived only over a few cycles of a bi-level input applied to the resistive input of the operational amplifier: I have discovered that after a few cycles the operational amplifier saturates because a DC offset input applied to the operational amplifier is integrated and thereby converted into a DC level that is superimposed on the triangular wave output of the integrator. The DC level ultimately reaches the saturation voltage of the amplifier and prevents further derivation of the triangular wave output.

To obviate this problem in accordance with a further aspect of the invention, the output of the integrator is applied via a feedback loop to the input of the amplifier. The feedback loop integrates the DC output of the integrator to derive a voltage having an amplitude equal to that of the offset voltage and a polarity opposite to that of the offset voltage. The integrator in the feedback loop has a time constant which is much much less than the frequency of the periodic bi-level voltage applied to the resistor of the integrator in the forward loop. Thereby, the output of the feedback integrator is basically a DC voltage having the required amplitude and polarity relationship.

Experiments with this circuit, however, have revealed that it has a tendency to oscillate with a sinusoidal component at a frequency determined by the components of the resistors and capacitors in the forward and feedback loops. This oscillating component, which has a frequency much lower than that of the triangular wave, is superimposed on the triangular wave output of the integrator in the forward loop. The oscillation is suppressed in accordance with another aspect of the present invention by providing filter circuitry in the feedback loop which functions as a high pass filter having a cutoff frequency between the triangular wave and oscillation frequencies to suppress the oscillation tendency.

Hence, in accordance with still a further aspect of the invention there is provided a new and improved zero average triangular wave generator including a forward loop integrator having an operational amplifier with a resistive input and a capacitive feedback. The resistive input is responsive to a bi-level input signal having a predetermined frequency. The forward loop integrator also has a tendency to be responsive to an offset voltage which tends to drive the amplifier of the forward loop integrator to saturation. A feedback loop integrator responds to the output of the forward loop integrator to derive a DC voltage having an amplitude equal to the amplitude of the offset voltage and a polarity opposite to the offset voltage polarity, to overcome the tendency for saturation. Because the circuit includes two integrators it has a tendency to oscillate. This tendency is suppressed by providing the circuit with a high pass filter having a cutoff frequency between the triangular wave and oscillation frequencies.

It is, accordingly, still another object of the present invention to provide a new and improved triangular wave generator.

An additional object of the invention is to provide a new and improved triangular wave generator including an integrator responsive to a bi-level input, wherein a tendency for an operational amplifier of the integrator to saturate is overcome.

Yet a further object of the invention is to provide a new and improved zero average triangular wave generator including a forward loop integrator responsive to a periodic bi-level source and a feedback loop integrator responsive to the output of the forward loop integrator for overcoming a tendency for the forward loop integrator to saturate, wherein the tendency of the series connected integrators to oscillate is suppressed.

The above and still further objects, features and advantages of the present invention will become apparent upon consideration of the following detailed description of several specific embodiments thereof, especially when taken in conjunction with the accompanying drawings.

BRIEF DESCRIPTION OF DRAWING

FIGS. 2A–2F are a series of waveforms useful for describing the operation of the apparatus illustrated in FIG. 1;

FIG. 3 is an electric schematic diagram of the apparatus in FIG. 1;

FIG. 4 is a circuit diagram of an analog embodiment that can be used for detecting the amount of fuel in each of the tanks of the apparatus schematically illustrated in FIG. 3;

FIG. 6 is a circuit diagram of a preferred triangular wave generator in accordance with a further aspect of the invention.

BEST MODE FOR CARRYING OUT THE INVENTION

Figure 1:
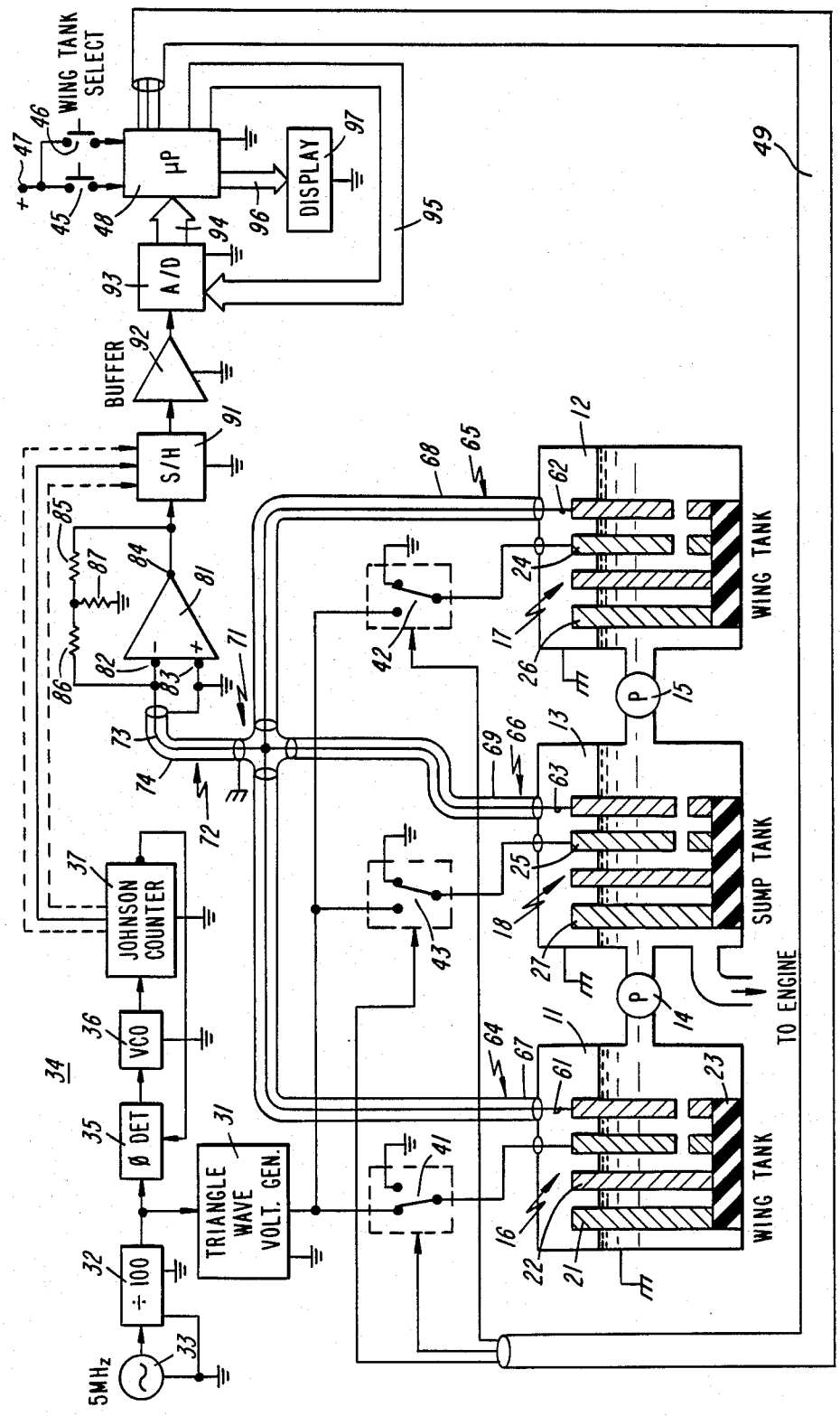
FIG. 1 is a schematic electrical and mechanical diagram of an embodiment of the invention as applied to detecting fuel volume in a pair fuel tanks in wings of an aircraft.

Reference is now made to FIG. 1 of the drawing wherein the volume of dielectric, petroleum liquid fuel in aircraft metal wing tanks 11 and 12 is determined by a capacitive measuring system in accordance with the present invention. The fuel in tanks 11 and 12 is selectively supplied via pumps 14 and 15 and associated conduits to metal sump tank 13, thence to an aircraft engine or plural engines. The fluid in tank 13 is maintained at a substantially constant level so that a measurement of the capacitance in tank 13 provides a reference value for the dielectric liquid. Each of tanks 11–13 is chassis or structure grounded.

To determine the volume of fluid in tanks 11 and 12, the tanks respectively include electrode assemblies 16 and 17; a similar assembly 18 is in tank 13 to provide a reference value for the dielectric liquid in tanks 11 and 12. Since all three electrode assemblies are essentially the same, a description of electrode assembly 16 suffices for the remaining electrode assemblies.

Electrode assembly 16 includes concentric vertically mounted metal electrode cylinders 21 and 22, both of which are fixedly mounted on dielectric block 23 on the bottom of tank 11. Each of cylinders 21 and 22 includes an aperture at the bottom thereof to allow the liquid in tank 11 to have the same level within the cylinders that it has in the remainder of the tank. As the liquid level in tank 11 rises and falls the amount of liquid dielectric material between cylinders 21 and 22 changes accordingly as does the capacitance of the electrode assembly. Hence, electrode assembly 16 can be considered as a variable capacitor wherein cylinders 21 and 22 are the electrodes of the capacitor and the value of the capacitor is determined by the level of the dielectric liquid between the electrodes. The impedance of the capacitor, however, is a complex function of the amount of dielectric liquid fuel and the contaminants in the fuel. The amount of contaminants is reflected as a resistive impedance in shunt with the capacitance impedance of the dielectric between electrodes 21 and 22 i.e. as a shunt resistor across a capacitor. As the amount of contaminants between electrodes 21 and 22 increases the resistive impedance between the electrodes decreases.

To monitor the dielectric constant of the fuel in tanks 11 and 12, which is subject to variation, electrode assembly 18 is provided in sump tank 13. Because Pumps 14 and 15 always maintain the level of liquid fuel in sump tank 13 above the top of electrode assembly 18, the capacitance between the metallic cylinders of electrode assembly 18 is a measure of the fuel dielectric constant.

To monitor the fuel level in tanks 11 and 12, as well as the dielectric constant of the fuel in tank 13, each of the tanks is selectively connected to a periodic symmetrical triangular wave derived by low output impedance voltage generator 31. The low output impedance of triangular wave generator 31 enables the increasing and decreasing voltage ramps derived by the generator to be converted into square wave currents by the capacitance in the electrode assembly connected to the generator. The resistive component of the electrode assembly responds to the triangular wave generator to cause a triangular wave replica of the output of the voltage generator to be derived. The amplitude of constant amplitude portions of the square wave is proportional to the capacitive impedance of the electrode assembly while the slope of the triangular wave current segment is proportional to the resistive impedance of the electrode assembly.

Triangular wave generator 31 is, in the preferred embodiment, driven by a 5 kHz square wave so that the output of the generator is a symmetrical triangular waveform having a zero average value, with a frequency of 5 kHz. The 5 kHz input to generator 31 is derived at an output of divide by 100 frequency divider 32, in turn driven by 5 MHz oscillator 33.

To determine the values of the capacitive impedance, and in some instances resistive impedance, of the electrode assembly being monitored, time slots that are synchronized with the triangular wave output voltage of generator 31 are derived. The time slots must occur at a predetermined time after a zero crossing of the output of generator 31. To these ends, the output of frequency divider 32 is applied to phaselock loop 34 including phase detector 35, voltage controlled oscillator 36 and Johnson counter 37. Johnson counter 37 derives an output that is fed back to phase detector 35, in turn directly responsive to the output of frequency divider 32. Detector 35 responds to the inputs thereof to derive an error voltage for voltage controlled oscillator 36. The frequency of oscillator 36 is maintained at 50 kHz and Johnson counter 37 provides a divide by ten frequency reduction factor so that both to phase detector 35 are 5 kHz. The desired time slot or slots are derived at outputs of predetermined counter stages of counter 37 as binary signal that subsist for one cycle of the 50 kHz output of voltage controlled oscillator 36, i.e., for one-tenth of a cycle of the 5 kHz square wave output of frequency divider 32.

The 5 kHz symmetrical triangular wave output of voltage generator 31 is selectively applied via switches 41, 42 and 43 to inner cylinders 22, 24 and 25 of electrode assemblies 16, 17 and 18. At any one time, only one of switches 41-43 is activated to a position where it connects the output of generator 31 to a corresponding inner cylinder 22, 24 or 25. The remaining switches connect the center electrodes or cylinders associated therewith to circuit ground. In the situation illustrated in FIG. 1, switch 41 connects the output generator 31 to electrode 22, while switches and 43 connect electrodes 24 and 25 to circuit ground. Alternatively, switch 43 is periodically connected to generator 31 simultaneously with one of switches 41 or 42 being connected to the generator. In such an instance the sum of the currents from electrode assembly 18 and from the assembly 16 or 17 that is being monitored for fuel level is supplied to processing circuitry described infra. A signal indicative of the sum of the currents is subtracted in the processing circuitry from a signal indicative of the current flowing through the electrode assembly being monitored to obtain a measure of the capacitance of the fluid in tank 13.

Closure of switches 41 and 42 is determined by the condition of manually actuated switches 45 and 46, which are interconnected by a conventional mechanical structure so that only one of the switches can be closed by an operator at a time. Switches 45 and 46 selectively connect a DC voltage at terminal 47 to an input of microprocessor 48, driven by a free running oscillator (not shown), typically having a frequency of 4 MHz. Microprocessor 48 responds to the closure of one of switches 45 or 46 to derive control voltages that are supplied via separate lines in cable 49 to switches 41 and 42.

In addition, microprocessor 48 periodically derives a signal that is coupled via a further lead in cable 49 to switch 43 so that electrode 25 of assembly 18 is periodically connected to the output of generator 31 regardless of which of tanks 11 or 12 is connected to be responsive to the output of generator 31 under the control switches 45 and 46. Switch 43 is periodically connected to couple the output of generator 31 to electrode 25. When switch 41 connects generator 31 to electrode 22, switches 42 and 43 connect electrodes 24 and 25 to ground; similarly, switches 41 and 42 connect electrodes 22 and 24 to ground while electrode 25 responds to generator 31.

To monitor the current components derived by electrode assemblies 16, 17 and 18, connections are established between outer cylindrical electrodes 21, 26 and 27 of electrode assemblies 16, 17 and 18 to inner lines 61, 62 and 63 of coaxial cables 64, 65 and 66, respectively. Cables 64, 65 and 66 include outer shielded sheaths 67, 68 and 69, respectively connected to metal tanks 11, 12 and 13, whereby shields 67-69 are connected to chassis ground.

Inner wires 61-63 and shields 67-69, of cables 64-66 are connected to each other at junction box 71, where cables 64-66 are connected to cable 72, including inner wire 73 and shielded sheath 74. At junction box 71 shields 67-69 and 74 are connected to chassis ground and inner lines 61-63 and 73 are connected with each other. From connection box 71, coaxial cable 72 extends to the location of a chassis for electronic equipment that derives indications of the volume of fuel in tanks 11 and 12. The electronic equipment is remote from tanks 11-13.

Circuitry to derive the fuel volume indications is driven by high input impedance, current to voltage converting DC operational amplifier 81. Amplifier 81 includes inverting input terminal 82 connected to inner wire 73 and non-inverting input terminal 83 connected to circuit ground and to the end of shield 74 of cable 72 that is adjacent terminal 82. A negative feedback loop between output terminal 84 and inverting input terminal 82 is formed by a T-network including series resistors 85 and 86, as well as shunt resistor 87.

The feedback circuitry associated with amplifier 81 enables the amplifier to have sufficient drive to maintain the voltage at inverting input terminal 82 at virtually ground potential. Hence, there is virtually no voltage differential between inner wire 73, where it is connected to terminal 82 and shield 74 where it is adjacent to the connection point between wire 73 and terminal 82. By maintaining the voltage at the junction of wire 73 and terminal 82 at a virtual ground potential, the capacitance of cable 72, as well as of cables 64–66, has virtually no effect on the current coupled into terminal 82 by line 73.

The arrangement of switches 41-43 prevents differential effects of stray capacitance between the output of generator 31 and electrode assemblies 16-18 on the current derived by the particular electrode assembly connected to be responsive to the output of generator 31. Because differential measurements are made between electrode assembly 16 or 17 relative to assembly 18, the magnitude of the differential current flowing from lead or wire 73 to inverting input terminal 82 is a function solely of the impedance of the electrode assembly 16 or 17 connected to be responsive to the output of triangular wave voltage generator 31.

Amplifier 81 and the feedback circuitry associated therewith have sufficient band width to enable the square wave and triangular wave current components flowing in wire 73 to be accurately converted into voltage replicas. The values of resistors 85, 86 and 87 are selected to enable the operational amplifier to have sufficient drive to enable inverting input terminal 82 to be at virtual ground potential, and such that overshoot does not occur in response to the square wave step current transitions. There is a tendency for overshoot (which is overcome by this network) because of the capacitance of the shielded cable between the inverting and non-inverting terminals of amplifier 81.

The output voltage of operational amplifier 81, at terminal 84, is applied to a signal input of sample and hold network 91 which, during any particular sampling interval, operates as a low pass filter to derive a DC level having an average value of the sample over the sampling interval. The output of amplifier 81 is sampled by sample and hold network 91 at times controlled by the states of Johnson counter 37. When a particular stage of Johnson counter 37 is reached during a particular cycle of the 5 kHz output of frequency divider 32, Johnson counter 37 enables the sample input of sample and hold network 91. The sample input is energized for 10% of the 5 kHz triangular wave output of voltage generator 31.

In one embodiment of the invention, sample and hold network 91 samples the output of amplifier 81 at the center of each constant amplitude component, when the ramping current component has a zero value. In this embodiment, the sampled output of amplifier 81, as averaged by the sample and hold network 91, indicates the measured capacitance value without any resistive effects in the impedance of the electrode assembly being monitored.

In a second embodiment of the invention, Johnson counter 37 activates sample and hold network 91 at different times during different cycles so that samples are taken at different times during the same direction of the output of amplifier 81. From the samples taken in this manner, the slope of the ramp is determined to enable a quantitative measure of the resistive component of the electrode assembly to be determined, as well as the capacitive component.

The DC levels at the output of sample and hold network 91 are coupled via buffer amplifier 92 to processing circuitry including analog-to-digital converter 93 which derives a parallel multi-bit output signal that is coupled via bus 94 to microprocessor 48. Microprocessor 48 responds to the multi-bit signal on bus 94 to calculate the capacitance values and to correlate the capacitance values into indications of fuel quantity in tanks 11 and 12. Microprocessor 48 responds to the 4 MHz clock to supply timing signals to control the operation of analog-to-digital converter 93 by way of cable 95. Microprocessor 48 derives a parallel multi-bit output which is coupled via bus 96 to display 97. Display 97 selectively provides the operator with the amount of fuel in tanks 11 and 12, as a function of the closure of switches 45 and 46. In addition, the display may provide a quantitative measure of the amount of contaminants in the monitored tank in one embodiment of the invention.

To provide a better understanding of the present invention, reference is now made to FIG. 2A wherein the output of triangular wave generator 31 is illustrated as a symmetrical triangle having a zero average value and constant amplitude peak values. Triangular wave 101 has positive and negative ramps 102 and 103 with positive and negative slopes of equal value. A zero crossing of each of ramps 102 and 103 occurs in the center of the ramp.

The triangular wave output of generator 31 is converted by the capacitance between electrodes 21 and 22 into square wave current waveform 104, FIG. 2B. Waveform 104 has constant positive and negative amplitude levels 105 and 106 which occur simultaneously with the derivation of ramps 102 and 103, respectively. At the peak value of waveform 101 where ramps 102 and 103 intersect, waveform 104 has a negative going step transition 107 between constant amplitude levels 105 and 106. Amplitude levels 105 and 106 have equal but opposite polarities and are centered about zero value 108. In response to a negative to positive transition of waveform 101, current waveform 104 has a positive going step transition 109 back to the amplitude of segment 105.

Segments 105 and 106 have amplitudes determined by the capacitive component of the electrode assembly connected to be responsive to the output of low impedance, triangular wave voltage generator 31. This is because of the well-known relationship that the current through a capacitor is equal to the capacitance of the capacitor times the rate of change of voltage with respect to time that is applied to the capacitor, i.e., $$i_c = (C dV/dt),$$

where
$i_c$ = the capacitor current,
C = the capacitance of the capacitor,
V = the voltage applied to the capacitor, and
t = time.

Since linearly increasing and decreasing voltages are applied to the capacitor, the rate of change of voltage with respect to time that is applied to the capacitor is a constant, i.e., $$dV/dT = K,$$

whereby the constant current levels flowing in the capacitor are directly proportional to the capacitance of the capacitor.

The current flowing in the electrode assembly connected to triangular wave voltage generator 31 includes a resistive component illustrated in FIG. 2C by waveform 111. Waveform 111 is a replica of waveform 101 since the current flowing through a resistor is directly proportional to the applied voltage and is inversely proportional to the resistance of the resistor. Hence, the slopes of ramping segments 112 and 113 of waveform 111 are determined by the amplitude of the resistive impedance of the electrode assembly responsive to generator 31.

The capacitive and resistive current components illustrated by waveforms 104 and 111, FIGS. 2B and 2C, are superimposed or summed so that the current flowing through the inner wire of the coaxial cable of the electrode assembly connected to the output of generator 31 has a composite waveform as illustrated in FIG. 2D. Waveform 114 thus has a zero average value with negative and positive step transitions 115 and 116 that respectively occur simultaneously with transitions 107 and 109 in waveform 104. The step changes of transitions 115 and 116 are equal in amplitude to the difference in amplitude between constant amplitude segments 105 and 106 of square wave 104.

Between segments 115 and 116 waveform 114 slopes downwardly, from the peak negative value of segment 115 to the peak negative value of segment 116, as indicated by negative sloping segment 117. Segment 117 has a slope equal to the slope of segment 113 so that at the center of segment 117, where segment 113 has a zero value, segment 117 has a value equal to the amplitude of segment 106. Hence, at the time associated with the center of segment 117 the composite current flowing in the inner cable of the electrode assembly responsive to generator 13 has an amplitude which is directly proportional to the capacitance of the electrode assembly.

In one embodiment of the invention, the value of waveform segment 117 is sampled for equal intervals on opposite sides of the center of segment 117, as illustrated by the positions of positive pulses 118 in waveform 119, FIG. 2E. Waveform 119 represents the output of Johnson counter 37 that is applied to sample and hold network 91. Sample and hold network 91 responds to each of pulses 118 to sample the output of operational amplifier 81, which is indicated by waveform 114. Such sampling is controlled while Johnson counter 37 has a count of 7 in a gamut of counts from zero to nine. Because waveform 114 is sampled in the center of segment of 117, where the zero axis crossing of segment 113 occurs, the resistive component does not enter into the measured indication of capacitance.

As described supra, the slope of segment 113, FIG. 2C, provides a measure of the resistance of the resistive component of the monitored electrode assembly. Because the slope of segment 117 equals the slope of segment 113, sampling the amplitudes of segment 117 at different times during the segment enables the value of the resistive component of the monitored electrode assembly to be determined. From a pair of sampled values taken along segment 117, an interpolation process is performed by microprocessor 48 to determine the value of segment 117 in the middle of the segment; alternatively, the capacitive component can be determined through the use of the same sampling technique described in connection with FIG. 2E.

Waveform 121, FIG. 2F, enables two samples of segment 117 to be taken. Waveform 121 includes sampling pulses 122 and 123 which are supplied to network 91 by Johnson counter 37 while the counter is in the sixth and eighth states, respectively. During sampling pulse 122, sample and hold network 91 samples the output of amplifier 81 to derive a signal value having an amplitude equal to the average value of segment 117 over the length of the sampling pulse. Similarly, sample and hold network 91 responds to the output of amplifier 81 while pulse 123 is generated, to derive a DC level commensurate with the average value of segment 117 while pulse 123 occurs.

To simplify the exposition, pulses 122 and 123 are illustrated in FIG. 2F as being derived during the same half cycle of waveform 114. In actuality, however, it may be desirable for pulses 122 and 123 to be coupled to the sample and hold network during alternate cycles of waveform 114, to enable the output of the sample and hold network to be adequately coupled into and processed by converter 93 and microprocessor 48.

From the sampled values obtained during pulses 122 and 123 the slope of segment 117 is derived. The calculation for the slope of segment 117 is directly proportional to the difference in amplitude of the samples divided by the difference in time at which the samples are taken. Since the time difference is a known predetermined value, the slope of segment 117 is easily calculated. From the calculated slope, microprocessor 48 calculates the resistive impedance of the monitored electrode assembly and computes a contamination factor associated therewith using well-known algorithms or mathematical relationships.

The capacitive component of the monitored electrode assembly is calculated by interpolating between the samples obtained during sampling times 122 and 123. Since sampling times 122 and 123 are equally displaced on opposite sides of the center of waveform segment 117, microprocessor 48 need only add the two sampled values together and divide them by two to determine the capactive impedance. This is because the resulting calculation provides a value equal to the value of segment 117 when segment 113 is making a zero crossing. Alternatively, sampling pulse 118 can be used in conjunction with sampling pulses 122 and 123, during different cycles of waveform 114, to enable the value of the capacitive impedance component to be determined. As a further alternative, a Johnson counter with an even number of stages, in excess of ten, can be employed and a sample can be taken in the middle of segment 117 and to one side of the middle of segment 117. The middle segment amplitude can be used to enable the value of the capacitive current segment 106 to be determined and used in conjunction with the amplitude of the other sample to determine the slope of segment 113.

Reference is now made to FIG. 3 of the drawing wherein there is illustrated a schematic diagram of an equivalent circuit of electrode assemblies 16–18, in combination with operational amplifier 81 and analog processing circuit 131 which drives meters 132. Oscillator 33 and associated components, namely frequency divider 32 and the components of phaselock loop 34, are included in square wave generator and phaselock loop 133, FIG. 3. Square wave generator and phaselock loop 133 derives a 5 kHz square wave output that is applied to triangular wave voltage generator 31; the square wave generator and phaselock loop also derive sampling pulses that are applied to processing circuit 131.

Electrode assemblies 16–18 are respectively illustrated in FIG. 3 as including series capacitors 134–136, respectively shunted by resistors 137–139. Capacitors 134–136 represent the capacitive impedance components of assemblies 16–18, while shunt resistors 137–139 represent the contaminant losses in the respective electrode assemblies.

The capacitances of coaxial cables 64–66 and 72 between the inner conductors and shields thereof are represented by shunt capacitor 141, connected between non-inverting input terminal 82 and chassis ground. Because of the properties of amplifier 81, described supra, the value of shunt capacitor 141 has no effect on the output voltage of operational amplifier 81.

The unshielded wires between triangular wave voltage generator 31 and electrode assemblies 16–18 have certain stray capacitances. There are stray capacitances between each of the wires connected between triangular wave voltage generator 31 and center electrodes 22, 24, and 25 which are represented in FIG. 3 by capacitors 143–145, connected between switches 41–43 and chassis ground. In addition, there is stray capacitance between the leads connected to electrodes 22, 24 and 25, as represented by capacitors 146, 147 and 148.

The connections of switches 41–43 are such that residual and/or extraneous voltages on capacitors 135 and 136 are discharged to ground and are not coupled to inverting input terminal 82 of amplifier 81. This result is seen by considering the circuit conditions illustrated in FIG. 3, wherein switch 41 is activated so that capacitor 134 and resistor 137 are driven by generator 31, while switches 42 and 43 are energized so that capacitors 135 and 136, as well as resistors 138 and 139 are connected to circuit ground. The circuit ground causes capacitors 144 and 145 to be short circuited through a path including the chassis ground and the connection of the armatures of switches 42 and 43 to circuit ground. Capacitor 147 is short circuited through the path including the armatures of switches 42 and 43 and circuit ground, as well as through the path including capacitors 144 and 145 and chassis ground. The circuit ground applied via the armatures of switches 42 and 43 to electrode assemblies !7 and 18 and the virtual circuit ground potential at inverting input terminal 82, as well as the chassis grounds for capacitors 141, 144, and 147 prevent voltages from being developed across capacitors 135 and 136; resistors 138 and 139 also have a tendency to dissipate voltages that might be stored in capacitors 135 and 136. Energization of switches 42 and 43 so that the armatures thereof are at circuit ground causes a closed loop to subsist from ground through the armature of switch 42, through capacitor 148, thence through capacitor 146 to ground via the armature of switch 43.

Reference is now made to FIG. 4 of the drawing wherein there is illustrated an analog block diagram of one arrangement that could be employed in processing circuit 131. The processing circuitry illustrated in FIG. 4 includes sample and hold networks 151–153, driven in parallel by the output voltage of buffer amplifier 81. Sample and hold networks 151–153 are selectively responsive to sampling pulses 118, FIG. 2E. Control of which one of sample and hold networks 151–153 receives sample pulses 118 is provided by which one of switches 41-43 is activated to be responsive to the output of triangular wave voltage generator 31. Thus, network 151 receives sample pulses 118 only while switch 41 connects generator 31 to electrode 22, network 152 receives sample pulses only while switch 42 connects generator 31 to electrode 24, and network 153 receives sample pulses only while switch 43 connects electrode 25 to generator 31.

The DC voltage levels at the outputs of networks 151-153 are respectively applied to low pass filters 154-156 which derive DC output voltages respectively representing the capacitances sensed by electrode assemblies 16, 17, and 18. The output voltage of filter 156 thus represents a reference capacitance value.

The DC output signals of low pass filters 154 and 155 are respectively applied to function generators 157 and 158, which are driven in parallel by the output of low pass filter 156. Function generators 157 and 158 store the signals coupled to them by the low pass filters and compute a non-linear function of the two stored values to provide an indication of the quantity of fuel sensed by electrode assembly 16 or 17. From the indicated differences, function generators 157 and 158 derive voltages representing the liquid volume in wing tanks 11 and 12 utilizing known mathematical relationships. The voltages derived by function generators 157 and 158 are respectively applied to meters 159 and 160.

Figure 5:
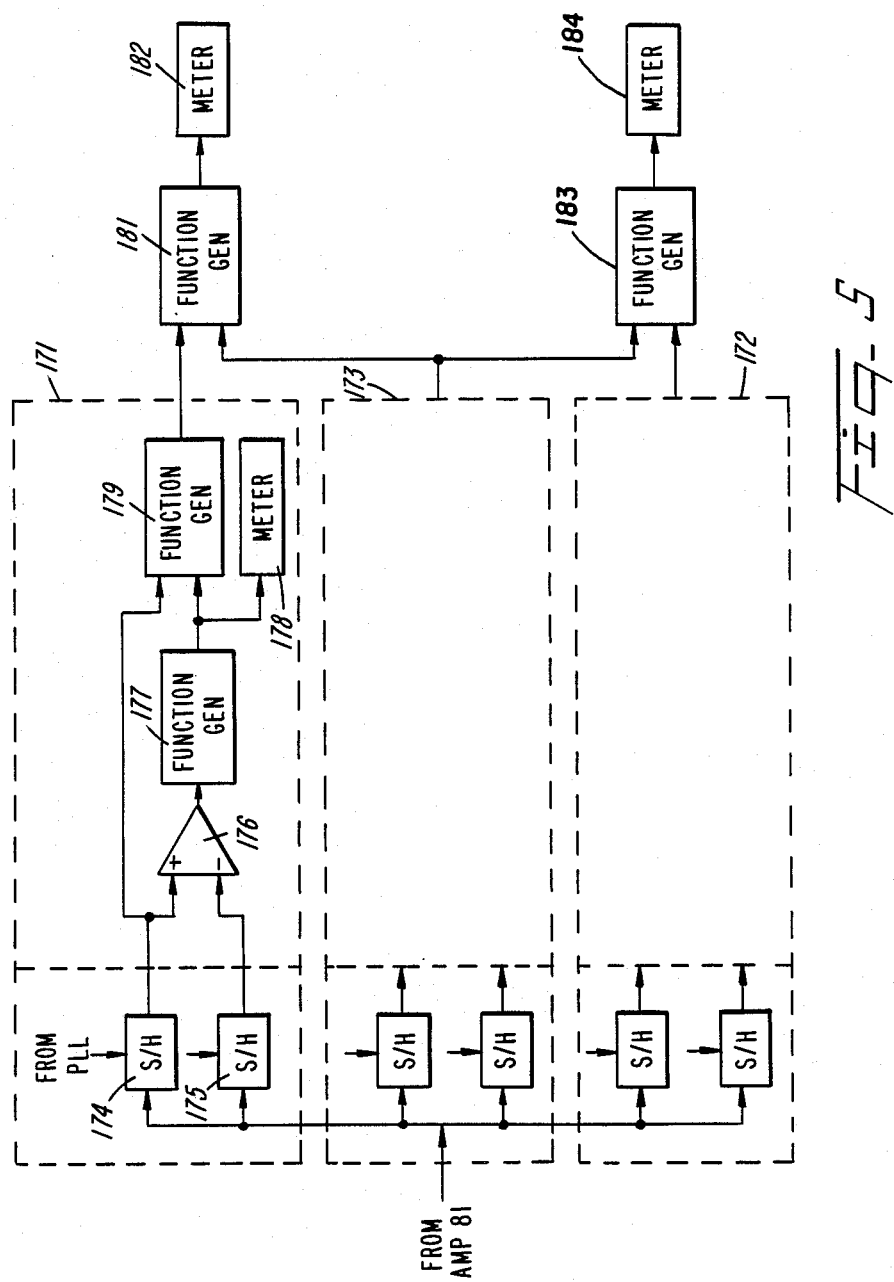
FIG. 5 is a circuit diagram of analog components that can be used to detect the volume of liquid and the degree of contaminants in the tanks in the apparatus schematically illustrated in FIG. 3.

To enable a quantitative measurement of the contamination and liquid level in tanks 11 and 12 to be determined by utilizing the two-sample pulse system illustrated in connection with FIG. 2E, processing circuit 131 has the configuration illustrated in FIG. 5. In FIG. 5, three separate processing channels 171-173 are respectively provided for the capacitive and resistive components sensed by electrode assemblies 16-18. Since each of processing channels 171-173 is the same, a description of only channel 171 is given.

Processing channel 171 includes sample and hold networks 174 and 175, driven in parallel by the output of operational amplifier 81. Sample and hold networks 174 and 175 are respectively responsive to sampling pulses 122 and 123, FIG. 2F, when switch 41 is connected so that electrode assembly 16 responds to generator 31. Thereby, sample and hold networks 174 and 175 derive DC output levels commensurate with the amplitude of slope segment 117, as averaged over the durations of sampling pulses 122 and 123. The output signals of networks 174 and 175 are applied to positive and negative input terminals of differential amplifier 176 that derives a DC output signal proportional to the difference between the average value of ramp segment 113 while sampling pulses 122 and 123 are derived. The difference voltage derived from amplifier 176 is applied to function generator 177 which converts it into a signal representing the resistive component of electrode assembly 16. Function generator 177 supplies a signal indicative of the resistance component to meter 178 which may be calibrated to convert the resistance representing signal amplitude into an indication of contaminants in electrode assembly 16. Alternatively, meter 178 can be responsive to an output of channel 172 which is indicative of the resistance component sensed by electrode assembly 18 in sump tank 13.

To indicate the capacitance sensed by electrode assembly 16, the output of sample and hold network 174 is applied to one input of function generator 179, having a second input responsive to the output of function generator 177. The signal supplied by sample and hold network 174 to function generator 179 indicates the value of segment 117, as averaged over the time interval associated with sampling pulse 122. The signal supplied to function generator 179 by function generator 177 indicates the slope of waveform segment 117. From the magnitude representing output of network 174 and the slope representing output of generator 177, function generator 179 derives a signal having an amplitude proportional to the capacitance sensed by assembly 16. The signal derived by function generator 179 in channel 171 is combined with a similar signal derived by a corresponding function generator in channel 173 to indicate the capacitance sensed by assembly 18 in sump tank 13. The signals derived by function generator 179 and by the corresponding function generator of channel 173 are combined in function generator 181, which is arranged to nonlinearly combine the two input signals thereof to derive a signal indicative of the volume of liquid in tank 11 using known mathematical equations and function generating circuitry. The output signal of function generator 181 drives meter 182 to provide a visual indication of the liquid volume in tank 11.

Function generator 183 is similarly responsive to function generators in channels 172 and 173 which correspond to function generator 179. Function generator 183 thereby derives a signal representing the volume of fluid in tank 12 when switch 42 connects the output of voltage generator 31 to electrode assembly 17. The signal derived by function generator 183 is coupled to meter 184 to provide the operator with a visual indication of the liquid volume in tank 12.

Reference is now made to FIG. 6 of the drawing wherein there is illustrated a circuit diagram of a preferred embodiment of triangular wave voltage generator 31. Triangular wave voltage generator 31 includes DC operational amplifiers 201, 202 and 203, each of which includes an inverting input terminal, a non-inverting grounded input terminal and an output terminal. Amplifiers 201 and 203 are connected as integrators, while operational amplifier 202 is connected as a polarity inverter having a gain of minus one. Amplifiers 202 and 203 are cascaded with each other and form a feedback loop between the output and inverting input terminals of amplifier 201. The output of amplifier 201 is coupled to electrode assemblies 16-18 via switches 41-43.

The integrator including operational amplifier 201 comprises resistor 204, responsive to the square wave output of frequency divider 32, and feedback capacitor 205. If the integrator including operational amplifier 201 were perfect and the square wave derived by frequency divider 32 were perfectly symmetrical, a triangular voltage would be derived at the output of operational amplifier 201. However, amplifier 201 has a tendency to be responsive to DC offset voltages that cause the amplifier output to saturate and prevent the derivation of a triangular waveform.

The feedback loop including amplifiers 202 and 203 overcomes the tendency for the output of amplifier 201 to be saturated in response to the offset voltage to which amplifier 201 is responsive. The feedback circuit including amplifiers 202 and 203 supplies the inverting input of amplifier 201 with a DC voltage that is equal in magnitude but opposite in polarity to the offset voltage. The feedback voltage is applied to the inverting input terminal of amplifier 201 by way of resistor 206, connected to the output of operational amplifier 203. Basically, the feedback network responds to the DC output of amplifier 201 that is derived by the amplifier in response to the offset and superimposed on the triangular wave output of amplifier 201.

The voltage at the output of amplifier 201 is coupled to the inverting input terminal of amplifier 202 by way of resistor 207. Feedback resistor 208 between the output and inverting input terminals of amplifier 202 has a value selected to enable the output of amplifier 202 to have the same amplitude as the output of amplifier 201; however, the output voltage of amplifier 202 is reversed in polarity relative to the output voltage of amplifier 201.

The output of amplifier 202 is applied to the inverting input terminal of operational amplifier 203 by way of resistor 209. Capacitor 211 is connected between the inverting and output terminals of amplifier 203. The integrator including operational amplifier 203 averages the triangular wave variations at the outputs of operational amplifiers 201 and 202 to zero and derives a DC voltage having a magnitude and polarity which is opposite to the magnitude and polarity of the DC offset voltage applied to integrator 201. Thereby, the tendency for amplifier 201 to be driven into saturation is overcome.

However, the feedback connections between the inverting input and output of operational amplifier 202 via amplifiers 202 and 203 cause relatively low frequency (much lower than the 5 kHz frequency of the triangular waves) sinusoidal oscillations to be established. These sinusoidal oscillations are superimposed on the triangular wave voltage variations derived at the output of amplifier 201. The sinusoidal variations would cause improper operation of the gauge apparatus illustrated in FIGS. 1 and 3–5 and must be prevented.

To these ends, oscillation at the low frequency determined by the values of resistors 206 and 209 and capacitors 205 and 211 is prevented by a high pass filter connected between the output of amplifier 202 and the inverting input terminal of amplifier 203. The high pass filter shunts resistor 209 and includes resistor 212, in series with capacitor 213. The values of resistor 212 and capacitor 213 make the loop including operational amplifiers 202 and 203 conditionally stable and suppress the tendency for the circuit to oscillate at a frequency considerably lower than the drive frequency for the triangular generator by frequency divider 32. In the preferred embodiment, resistors 209 and 212 have values of 121 kilohms and 12.1 kilohms, while capacitors 211 and 213 have values of 1 microfarad and 0.1 microfarad, respectively.

While there have been described and illustrated several specific embodiments of the invention, it will be clear that variations in the details of the embodiments specifically illustrated and described may be made without departing from the true spirit and scope of the invention as defined in the appended claims. For example, the functions performed by phaselock loop 34 can be performed by a microprocessor. Also more than two fuel tanks can be monitored.

I claim:

1. A system for measuring the value of a capacitive impedance comprising a periodic non-sawtooth triangular voltage source that has a zero average value and changes linearly as a function of time adapted to be connected to the impedance, the capacitive impedance responding to said voltage source by deriving a current having a pair of constant amplitude components, and means for sampling the amplitude of the derived current for equal durations on opposite sides of zero crossings of the voltage applied to the impedance to provide an indication of the value of one of said constant amplitude components and a measure of the capacitive impedance.

2. A system for measuring the value of a capacitive impedance comprising an AC voltage source adapted to be connected to the capacitive impedance, the AC voltage of the AC voltage source having a fundamental component with a predetermined frequency, a DC operational amplifier having inverting and non-inverting input terminals and an output terminal, said amplifier having a cutoff frequency greater than the predetermined frequency, shielded cable means having a grounded shield and an inner line, the inner line having first and second terminals respectively connected to one electrode of the capacitive impedance and the inverting input terminal, the non-inverting input terminal being connected to ground so there is a shunt capacitance of the shielded cable between the inner line and the shield across the inverting and non-inverting terminals, the operational amplifier being arranged so the inverting input terminal is at virtual ground potential so that there is virtually no voltage between the inverting and non-inverting input terminals and the capacitive impedance and voltage source are connected in series with each other and the inverting input terminal, the inner line supplying a current to the inverting input terminal indicative of the value of the capacitive impedance, the operational amplifier responding to the current supplied to the inverting input terminal to derive a voltage that is a replica of the current supplied to the inverting input terminal, and means responsive to the voltage derived by the operational amplifier for indicating the value of the capacitive impedance.

3. A system for measuring the value of a capacitor having a resistance impedance in shunt therewith so that the value of the shunt resistive impedance has no effect on the measurement comprising a source of periodic voltage with a symmetrical triangular waveform having a zero average value adapted to be applied to the capacitor and shunt resistive impedance, the capacitor and resistive impedance responding to the voltage to derive first and second current components respectively shaped as (i) a square wave having positive and negative constant amplitude segments and (ii) a replica of the symmetrical triangular waveform so that the replica has a zero crossing in the center of each constant amplitude segment, and means responsive to the sum of the first and second components for indicating the average value of the sum of the first and second components for equal durations on opposite sides of the zero crossing.

4. A system for measuring the value of a resistive impedance shunting a capacitor comprising a source of periodic voltage with a waveform that increases linearly as a function of time adapted to be applied to the resistive impedance and capacitor, the resistive impedance and capacitor responding to the voltage to derive first and second current components respectively shaped as a replica of the waveform and a waveform having constant amplitude segments separated by step transitions, and means responsive to the sum of the first and second components for indicating the slope of the first component, the indicated slop being a measure of the value of the resistive impedance.

5. The system of claim 4 further including means responsive to the sum of the first and second components for indicating the amplitude of one the constant amplitude segments, the indicated amplitude of the constant amplitude segment providing a measure of the value of the capacitor.

6. A system for monitoring the amount of liquid dielectric fuel in a tank comprising a capacitive impedance including first and second electrodes immersed in the fuel in the tank, the level of the liquid dielectric fuel determining the capacitance between the first and second electrodes, the fuel having a tendency to have contaminants therein, the contaminants being reflected as a shunt resistive impedance for the capacitive impedance between the first and second electrodes, a source of periodic voltage that increases linearly as a function of time applied to the first and second electrodes, the impedances in the tank responding to said voltage by deriving a current having a constant amplitude component and a component that is a replica of the periodic voltage, and means responsive to the sum of said components for effectively measuring the amplitude of said constant amplitude component to indicate the mount of fuel in the tank independently of effects of the shunt resistive impedance of the electrodes.

7. The system of claim 6 wherein the component that is a replica of the slope of the periodic component has a slope indicative of the resistance value of the resistive impedance, further including means responsive to the sum of said components for indicating the slope of the replica to provide a measure of a resistance value of the resistance impedance.

8. The system of claim 6 further including a DC operational amplifier having inverting and non-inverting input terminals and an output terminal, a feedback resistor connected between the inverting input and output terminals, a shielded cable having a shield and an inner wire, first and second ends of the inner wire, being respectively connected to the inverting input terminal and the first electrode, an end of the shield adjacent the first end being connected to the non-inverting input terminal, the second electrode being connected to be responsive to the voltage source so that the first and second electrodes are in series between the voltage source and the inverting input terminal; the operational amplifier, the feedback resistor, the first and second electrodes and the voltage source being interconnected so that the inverting input terminal is at a virtual ground potential whereby current supplied to the inverting input terminal is substantially independent of shunt capacitance of the shielded cable connected between the inverting and non-inverting input terminals.

9. The system of claim 8 wherein the system includes plural capacitive impedances having said first and second electrodes immersed in a fuel tank, one of said plural capacitive impedances being the capacitive impedance in said tank, another of said plural capacitive impedances being a capacitive impedance in a sum tank containing the same fuel as said one tank, switch means for selectively connecting the voltage source to the second electrodes of only one of said capacitive impedances during a first interval during several cycles of the source while grounding the second electrodes of all of the others of said capacitance impedances, the first electrodes of all of said capactive impedances being connected to the second end of the inner wire.

10. The apparatus of claim 6 wherein the voltage source includes a triangular wave generator that applies a triangular wave voltage having a zero average value to the electrodes, the means for measuring including means for sampling the value of the sum of the first and second components for equal durations on opposite sides of zero crossings of the replica.

11. The apparatus of claim 10 wherein the sum is sampled for a continuous interval beginning prior to the zero crossing and ending after zero crossing.

12. Apparatus for measuring an impedance including a capacitive component shunted by a resistive component comprising a voltage source for deriving a periodic waveform having a component that changes linearly as a function of time, said linearly changing component having a zero crossing, said voltage source being adapted to be applied to the impedance so that a current flows through the impedance, said current including superimposed constant amplitude and linearly changing components flowing through the impedance in response to the capacitive and resistive components, means for sensing the average amplitude of the current for equal oppositely displaced durations on opposite sides of the zero crossing, and means responsive to the sensed average current amplitude for indicating the value of the capacitive component.

13. The apparatus of claim 12 wherein the means for sensing samples the current at the zero crossing time.

14. The apparatus of claim 12 wherein the means for sensing samples the current at first and second times equally displaced from and not including the zero crossing time.

15. Apparatus for measuring an impedance including a capacitive component shunted by a resistive component comprising a voltage source for deriving a periodic waveform having a component that changes linearly as a function of time, said linearly changing component having a zero crossing, said voltage source being adapted to be applied to the impedance so that a current flows through the impedance, said current including superimposed constant amplitude and linearly changing components flowing through the impedance in response to the capacitive and resistive components, means for sensing the amplitude of the current at a plurality of different times relative to the zero crossing while the linearly changing current component is being applied to the impedance, and means responsive to the sensed values at the plural different times for indicating the values of the capacitive and resistive components.

16. The apparatus of claim 15 wherein the means for indicating includes means for determining the slope of the linearly changing current component, the slope determination being indicative of the resistive component.

17. The apparatus of claim 16 wherein the means for determining the slope of the linearly changing current component includes means for sensing the amplitude of the linearly changing current at two different points along the same ramp direction of the current component and for subtracting the sensed values.

18. The apparatus of claim 17, wherein the sensed amplitudes are taken on opposite sides of a zero crossing of the linearly changing current component.

19. The apparatus of claim 18 wherein the sensed amplitudes are equally displaced form the zero crossing, and means for interpolating between the two sensed value to obtain a measure of the current flowing through the impedance at the time of zero crossing, the measure of the current at the time of the zero crossing being indicative of the value of the capacitance component.

20. The apparatus of claim 17 wherein one of the sensed amplitudes is determined at the time of the zero crossing and the other sensed value is determined at a time displaced from the zero crossing, the sensed value at the time of the zero crossing being indicative of the capacitive component.

21. The apparatus of claim 16 wherein one of the sensed values is determined at the time of the zero crossing and the other sensed value is determined at a time displaced from the zero crossing, the sensed value at the time of the zero crossing being indicative of the capacitive component.

22. Apparatus for indicating the height of a dielectric liquid in a measurement tank comprising a reference tank in fluid flow relation with the measurement tank so that liquid having the same properties is in the measurement and reference tanks and the level of liquid in the reference tank is maintained constant, a first pair of electrodes in the measurement tank, a second pair of electrodes in the reference tank, electric impedance between the second electrodes including a capacitive component indicative of the nature of the dielectric of the liquid and a resistive component indicative of contaminants in the dielectric liquid, electric impedance between the first electrodes being a function of the height of liquid in the measurement tank, as well as of the nature of the dielectric liquid an contaminants therein, a voltage source for deriving a periodic voltage waveform having a component that changes linearly as a function of time, the periodic voltage waveform being applied to the first and second pairs of electrodes, the first and second pairs of electrodes responding to the periodic voltage waveform to derive first and second currents respectively indicative of the impedances between the first and second electrodes, each of the first and second currents including capacitive and resistive components, the capacitive and resistive current components being respectively constant amplitude and sloping wave shapes and means responsive to the magnitudes of the constant amplitude components of the first and second currents for deriving an indication of the level of liquid in the measurement tank independently of variations of the dielectric and contaminants of the liquid.

23. The apparatus of claim 22, further including means responsive to the slope of the sloping wave shape component of one of the currents for indicating the amount of contaminants in the liquid.

24. The apparatus of claim 23 wherein the means for indicating the amount of the contaminants includes means for measuring the slope of the current flowing through one of said pairs of electrodes during application of the linearly changing voltage waveform component to said one pair of the electrodes.

25. The apparatus of claim 24 wherein the means for measuring includes means for determining the slope of the linearly changing current component, the slope determination being indicative of the resistive component.

26. The apparatus of claim 25 wherein the means for measuring includes means for sensing the values of the sum of the resistive and capacitive components, the sensed values being taken on opposite sides of a zero crossing of the linearly changing current component.

27. The apparatus of claim 26 wherein the sensed values are equally displaced from the zero crossing, and means for interpolating between the two sensed values to obtain a measure of the current flowing through the impedance at the time of zero crossing, the sensed current at the time of the zero crossing being indicative of the value of the capacitive component.

28. The apparatus of claim 22 wherein the periodic voltage waveform has a zero axis crossing while the linearly changing voltage component is being derived, and wherein the means for indicating includes means for determining the value of the capacitive component, the means for determining the value of the capacitive component including means for sensing the amplitudes of the currents flowing through said electrodes while the voltage source crosses the zero axis.

29. The apparatus of claim 22 further including a DC operational amplifier having inverting and non-inverting input terminals and an output terminal, feedback resistor means connected between the inverting input and output terminals, a shielded cable having a shield and an inner wire, first and second ends of the inner wire being respectively connected to the inverting input terminal and being selectively connected to first individual electrodes of the first and second electrode pairs, an end of the shield adjacent the first end being connected to the non-inverting input terminal, second individual electrodes of the first and second electrode pairs being selectively connected to be responsive to the voltage source so that the first and second electrode pairs are selectively in series between the voltage source and the inverting input terminal; the operational amplifier, the feedback resistor means, the first and second electrode pairs and the voltage source being interconnected so that the inverting input terminal is at a virtual ground potential, whereby current supplied to the inverting input terminal is substantially independent of shunt capacitance of the shielded cable connected between the inverting and non-inverting input terminals.

30. The apparatus of claim 29 further including means for selectively short circuiting at least one of said first individual electrodes to ground while another of said first individual electrodes is connected to respond to the voltage of the voltage source.

31. The apparatus of claim 29 wherein the feedback resistor means includes resistance means connected in series between the inverting input and output terminals, and a shunt resistor between a tap of the resistance means and ground, the position of the tap and the value of the shunt resistor being such that there is sufficient drive to the inverting input terminal to provide the virtual ground and to pressure the wave shape of the current components flowing through the electrode pairs.

32. The apparatus of claim 22 wherein the periodic source comprises a triangular wave generator.

33. The apparatus of claim 32 wherein the triangular wave generator comprises a bi-level signal source, and a first integrator including a first DC operational amplifier with an input responsive to the bi-level signal and a first feedback capacitor, said first amplifier having a tendency to be subjected to DC offset voltages which are integrated by the first integrator to drive the first amplifier to saturation, a feedback loop for suppressing the tendency for the first amplifier to be driven to saturation, the feedback loop being responsive to an output voltage of the amplifier for supplying the amplifier input with a DC signal having a magnitude and polarity to overcome the offset voltages, the feedback loop having a second integrator including a second DC operational amplifier and a second feedback capacitor, the first and second integrators having a tendency to oscillate at a predetermined frequency when connected together via the feedback loop, and filter means in the feedback loop for suppressing the oscillation tendency, whereby the first integrator derives the triangular wave without oscillation at the predetermined frequency.

34. The apparatus of claim 33 wherein the filter means includes a capacitor shunting an input resistor of the second operational amplifier, the input resistor being responsive to the waveform having the same shape as a waveform at the output of the first operational amplifier.

35. The apparatus of claim 34 wherein the oscillations are at a frequency considerably lower than the frequency of the periodic bi-level signal, said filter means being a high pass filter having a cutoff frequency between the frequencies of the oscillations and the bi-level signal.

36. A system for measuring the value of a capacitor having a resistive impedance in shunt therewith so that the value of the shunt resistive impedance has no effect on the measurement, comprising a source of periodic voltage with a symmetrical triangular waveform having a zero average value adapted to be applied to the capacitor and shunt resistive impedance, the capacitor and resistive impedance responding to the voltage to derive first and second current components respectively shaped as (i) a square wave having positive and negative constant amplitude segments and (ii) a replica of the symmetrical triangular waveform so that the replica component has a zero crossing in the center of each constant amplitude segment, and means responsive to the sum of the first and second components for sampling the value of the sum of the first and second components for equal durations on opposite sides of the zero crossing.

37. The apparatus of claim 36 wherein the sum is sampled for a continuous interval beginning prior to the zero crossing and ending after the zero crossing.

38. The apparatus of claim 36 wherein the sum is sampled for first and second discontinuous intervals on opposite sides of the zero crossing.

39. Apparatus for indicating the height of a dielectric liquid in a measurement tank comprising a reference tank in fluid flow relation with the measurement tank so that liquid having the same properties is in the measurement and reference tanks and the level of liquid in the reference tank is maintained constant, a first pair of electrodes in the measurement tank, a second pair of electrodes in the reference tank, an electric impedance between the second electrodes including a capacitive component indicative of the nature of the dielectric of the liquid and a resistive component indicative of contaminants in the dielectric liquid, an electric impedance between the first electrodes being a function of the height of liquid in the measurement tank, as well as of the nature of the dielectric liquid and contaminants therein, a voltage source applied to the first and second pairs of electrodes, the first and second pairs of electrodes responding to the voltage of the source to derive first and second currents respectively indicative of the impedances between the first and second electrodes, each of the first and second currents including capacitive and resistive responsive components, and means responsive to the magnitudes of the capacitive responsive components of the first and second currents for deriving an indication of the level of liquid in the measurement tank independently of variations of the dielectric and contaminants of the liquid.

* * * * *